United States Patent
Gräupner et al.

(10) Patent No.: US 9,146,475 B2
(45) Date of Patent: Sep. 29, 2015

(54) PROJECTION EXPOSURE SYSTEM AND PROJECTION EXPOSURE METHOD

(71) Applicant: Carl Zeiss SMT GmbH, Oberkochen (DE)

(72) Inventors: Paul Gräupner, Aalen (DE); Olaf Conradi, Westerhofen (DE); Christoph Zaczek, Heubach (DE); Wilhelm Ulrich, Aalen (DE); Helmut Beierl, Heidenheim (DE); Toralf Gruner, Aalen-Hofen (DE); Volker Graeschus, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 340 days.

(21) Appl. No.: 13/786,134

(22) Filed: Mar. 5, 2013

(65) Prior Publication Data
US 2013/0182234 A1    Jul. 18, 2013

Related U.S. Application Data

(63) Continuation of application No. PCT/EP2010/005949, filed on Sep. 30, 2010.

(51) Int. Cl.
*G03B 27/72* (2006.01)
*G03F 7/20* (2006.01)

(52) U.S. Cl.
CPC ........ *G03F 7/70191* (2013.01); *G03F 7/70308* (2013.01)

(58) Field of Classification Search
CPC ............ G03F 7/70191; G03F 7/70308; G03F 7/70341

USPC ....................................................... 355/71, 53
See application file for complete search history.

(56) References Cited

U.S. PATENT DOCUMENTS

| 2002/0171815 | A1 | 11/2002 | Matsuyama et al. |
| 2003/0043356 | A1 | 3/2003 | Shiraishi |
| 2005/0280896 | A1 | 12/2005 | Shang |
| 2009/0053618 | A1* | 2/2009 | Goehnermeier ................. 430/5 |

(Continued)

FOREIGN PATENT DOCUMENTS

| DE | 10218989 | 11/2003 |
| JP | 05-047624 | 2/1993 |

(Continued)

OTHER PUBLICATIONS

JP 2006-080135, machine translation, 2006.*

(Continued)

*Primary Examiner* — Peter B Kim
(74) *Attorney, Agent, or Firm* — Fish & Richardson P.C.

(57) ABSTRACT

A projection exposure system includes an illumination system configured to illuminate a mask with radiation. The projection exposure system also includes a projection objective configured to project an image of a pattern of the mask onto a radiation-sensitive substrate. The projection exposure system further includes an angle-selective filter arrangement arranged at or close to a field surface of the projection objective in a projection beam path optically downstream of the object surface. The angle-selective filter arrangement is effective to filter radiation incident on the filter arrangement according to an angle-selective filter function.

33 Claims, 7 Drawing Sheets

(56) References Cited

U.S. PATENT DOCUMENTS

2009/0059189 A1 3/2009 Goehnermeier et al.
2009/0213354 A1 8/2009 Sandstrom et al.

FOREIGN PATENT DOCUMENTS

| JP | 07-078753 | 3/1995 |
| JP | 2006-080135 | 3/2006 |
| TW | 200600841 | 1/2006 |
| TW | 200717025 | 5/2007 |
| WO | 03/092256 | 6/2003 |

OTHER PUBLICATIONS

International Search Report and Written Opinion issued in PCT/EP2010/005949, mailed Aug. 25, 2011.
Taiwanese Office Action, with translation thereof, for corresponding TW Application No. 100134770, dated Dec. 17, 2013.
Copy of Japanese Office Action, with translation thereof, for JP Appl No. 2013-530574, dated Mar. 10, 2014.
Michael J. Kidger "Fundamental Optical Design", SPIE Press, Bellingham, Washington, USA (Chapter 2), 2002.

* cited by examiner

PROJECTION EXPOSURE SYSTEM AND PROJECTION EXPOSURE METHOD

CROSS-REFERENCE TO RELATED APPLICATIONS

This application is a continuation of, and claims priority under 35 USC 120 to, International Patent Application Serial No. PCT/EP2010/005949, filed Sep. 30, 2010, the entire contents of which are incorporated by reference herein.

FIELD

The disclosure relates to a projection exposure system and to a projection exposure method.

BACKGROUND

Microlithographic projection exposure methods and systems are currently used to fabricate semiconductor components and other finely patterned components. A microlithographic exposure process involves using a mask (reticle) that carries or forms a pattern of a structure to be imaged. The pattern is positioned in a projection exposure system between an illumination system and a projection objective in a region of the object surface of the projection objective. Primary radiation is provided by a primary radiation source and transformed by optical components of the illumination system to produce illumination radiation directed at the pattern of the mask in an illuminated field. The radiation modified by the mask and the pattern passes through the projection objective, which forms an image of the pattern in the image surface of the projection objective, where a substrate to be exposed is arranged. The substrate normally carries a radiation-sensitive layer (photoresist).

When a microlithographic projection exposure system is used in the manufacture of integrated circuits, the mask (reticle) may contain a circuit pattern corresponding to an individual layer of the integrated circuit. This pattern can be imaged onto an exposure area on a semiconductor wafer which serves as a substrate.

In many applications the projection objective is designed as a reduction projection objective forming a demagnified image of the pattern on the substrate at a magnification ratio $|\beta|<1$, for example at 4:1 ($|\beta|=0.25$) or 5:1 ($|\beta|=0.2$) reduction. Unit magnification projection objectives ($|\beta|=1$) may also be used. Magnifying projection objectives with magnification $|\beta|>1$ may be used, for example, in the manufacturing of liquid crystal display panels or other large micro structured components.

Projection exposure is performed at a given image-side numerical aperture NA appropriately selected for the specific type of pattern to be imaged. While a projection objective is designed with regard to aberration correction etc. to allow a specific maximum image-side numerical aperture (design NA), the effective numerical aperture actually used in an exposure process is normally defined by a mechanical aperture stop arranged at or close to a pupil surface of the projection objective, i.e. at a position which is in Fourier transform relationship to the image surface of the projection objective. A non-variable aperture stop with a fixed diameter of the aperture opening may be employed. Variable aperture stops allowing to vary the diameter of the aperture opening are employed in many cases, thereby allowing to set for specific applications the effective image-side numerical aperture to values smaller than the maximum possible image-side NA of the projection objective.

A variable aperture stop at a pupil surface of the projection objective involves a relatively well corrected pupil in order to ensure that changes in the effective numerical aperture actually used for an exposure by stopping up or stopping down the aperture stop have substantially the same effect for all field points of the field to be imaged (field-constant effect). Further, a mechanical aperture stop involves installation space in the region of the pupil surface. Therefore, no refractive or reflective optical surface of an optical element should be in the region of the pupil surface. Further, positions optically close to a pupil surface may be preferred positions of pupil filter elements and/or adjustable manipulation devices for deliberately (actively) changing the imaging properties of a projection objective. Therefore, it may be difficult to provide a variable or non-variable mechanical aperture stop at an appropriate pupil position of the projection objective.

A pattern of a mask may include different types of partial patterns. For example, a line pattern with densely packed parallel lines may be present in one portion of a pattern, and isolated features, such as contact holes, may be present in another portion of a mask. While imaging of line patterns with small pitch may involve a relatively high NA for imaging with sufficient resolution, isolated features may be imaged best with relatively lower NA values, for example in order to increase the depth of focus (DOF) of the projection objective. It may be difficult to find a suitable compromise NA to image both dense lines and isolated features with sufficient quality.

Further, due to the increasing demands on the efficiency of the lithographic manufacturing process there is a tendency to increase the power of the light sources. Also, progressively shorter wavelengths are used. Specific illumination settings are employed to optimize the imaging conditions for various pattern types. As a result, various time-dependent changes in the properties of optical materials and other components within the projection system are observed, which may sensibly affect the imaging quality of the exposure system. Non-uniform heating of lens groups and other transparent optical elements ("lens heating") during operation due to an increased absorption in parts of the optical system is one effect dynamically influencing the imaging properties.

SUMMARY

The disclosure provides a projection exposure system and a projection exposure method which allow setting desired values for the effective image-side numerical aperture NA substantially without limitation imposed by the desired properties for a conventional mechanical aperture stop at a pupil surface of the projection objective.

The disclosure also provides a projection exposure system and a projection exposure method configured to be operated/performed at stable operating conditions at various illumination settings and with different types of mask and patterns.

The disclosure further provides a projection exposure system and a projection exposure method with reduced sensitivity to effects caused by heating of optical and other components.

In addition, the disclosure provides a projection exposure system and a projection exposure method capable of faithfully imaging mask structures having different types of partial patterns side by side.

An angle-selective filter arrangement is arranged in a filter plane at or close to a field surface of the projection objective. The field surface at or close to the filter plane is optically conjugate to the image surface of the projection objective, where the image of the pattern is formed on the substrate. Therefore, the position of the filter arrangement is optically remote from a pupil surface.

There are various ways to characterize a position "optically close to a field surface". In general, it may be useful to define the axial position of an optical surface, such as a surface of a filter arrangement, by the paraxial sub-aperture ratio SAR which is defined here as:

SAR=(sign CRH)*(MRH/(|MRH|+|CRH|)).

In this definition, parameter MRH denotes the paraxial marginal ray height and parameter CRH denotes the paraxial chief ray height of the imaging process, and the signum function sign(x) denotes the sign of x, in which case sign(0)=1 may be agreed. For the purpose of this application, the term "chief ray" (also known as principle ray) denotes a ray running from an outermost field point (farthest away from the optical axis) of an effectively used object field to the center of the entrance pupil. In rotational symmetric systems the chief ray may be chosen from an equivalent field point in the meridional plane. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective objective field is used. Both chief ray and marginal ray are used here in the paraxial approximation. The radial distances between such selected rays and the optical axis at a given axial position are denoted as "chief ray height" (CRH) and "marginal ray height" (MRH), respectively.

A definition of the paraxial marginal ray and the paraxial chief ray may be found, for example, in: "Fundamental Optical Design" by Michael J. Kidger, SPIE PRESS, Bellingham, Wash., USA (Chapter 2), which document is incorporated herein by reference.

The paraxial sub-aperture ratio as defined here is a signed quantity providing a measure describing the relative proximity of a position along an optical path to a field plane or a pupil plane, respectively. In the definition given above, the paraxial sub-aperture ratio is normalized to values between −1 and 1, where the condition SAR=0 holds for a field plane and a point of discontinuity with a jump from SAR=−1 to SAR=+1 or from SAR=+1 to SAR=−1 corresponds to a pupil plane. Therefore, optical surfaces being positioned optically close to a field plane (such as the object surface or the image surface) are characterized by values of the paraxial sub-aperture ratio close to 0, whereas axial positions optically close to a pupil surface are characterized by absolute values for the paraxial sub-aperture ratio close to 1. The sign of the paraxial sub-aperture ratio indicates the position of the plane optically upstream or downstream of a reference plane. For example, the paraxial sub-aperture ratio a small distance upstream of a pupil surface and a small distance downstream of a pupil surface may have the same absolute value, but opposite signs due to the fact that the chief ray height changes its sign upon transiting a pupil surface. The definition can be made by, for example, the sign of the intersection point of a coma ray on the relevant surface.

Planes optically close to a field surface therefore have paraxial sub-aperture ratios that are near 0, while planes optically close to a pupil surface have paraxial sub-aperture ratios that have absolute values near to 1. Positions optically close to a field surface may be characterized by an absolute amount of the paraxial sub-aperture ratios which is close to 0, for example |SAR|≤0.4, for example.

In some embodiments the filter arrangement is arranged such that at least one optical surface of the filter arrangement is at a position where |SAR|<0.4. Preferably, the condition |SAR|<0.2 or even the condition |SAR|<0.1 is fulfilled. If |SAR| is small, a clear separation of the filtering effect for different adjacent field points may be obtained.

The filter arrangement is arranged in a projection beam path optically downstream of the object surface. In operation, the pattern is placed in the object surface. Therefore, in operation, the influence of the pattern on the angular distribution of radiation rays is considered in the angle-selective filtering by the filter arrangement. Specifically, rays with diffraction angles larger than a maximum diffraction angle desired for an imaging process may be blocked efficiently by the filter arrangement. Also, where the filter arrangement is arranged downstream of the mask, stray radiation caused by undesired artifacts on the mask may be blocked efficiently.

The filter arrangement may be positioned optically upstream of a pupil surface of projection objective such that radiation passes the pupil surface after having passed the angle-selective filter arrangement. In this case, the filter arrangement is positioned on an object side of the pupil surface. Where a projection objective has more than one pupil surface, the field plane associated with the filter arrangement may be upstream of all pupil surfaces or at least upstream of a last pupil surface closest to the image surface.

In an embodiment the field plane associated with the angle-selective filter arrangement is the image plane of the projection objective. In this case the angle-selective filter arrangement is arranged optically between a last pupil surface closest to the image surface and the image surface. The filter arrangement may be a part of the projection objective. For example, an exit side surface of a last optical element may be coated with a filter coating. It is also possible to place the filter arrangement between the exit side of the projection objective and the image surface. In this case a change of filter arrangements is facilitated.

The term "angle-selective filter arrangement" denotes a filter arrangement having a filtering effect which varies deliberately and substantially and according to a predefined filter function with the angle of incidence, AOI, of rays incident on the filter arrangement. The angle of incidence, AOI, is defined as the angle enclosed between a ray impinging on the filter arrangement and the surface normal at the point of incidence. Where the surface normal of the filter arrangement is aligned parallel to the optical axis of the projection objective, the sine of the angle of incidence (sin(AOI)) corresponds to the numerical aperture of the respective ray on the entry side of the filter arrangement.

The filter function (or the filter arrangement, respectively) has a pass band with relatively high transmittance (low attenuation) of intensity of incident radiation for rays having angles of incidence smaller a cut-off angle of incidence $AOI_{CUT}$, and a stop band with relatively low transmittance (high attenuation) of intensity of incident radiation for rays having angles of incidence greater than the cut-off angle of incidence. Rays having angles of incidence corresponding to an angle within the pass band pass the filter arrangement with relatively little loss of intensity, whereas rays having an angle of incidence within the stop band are substantially blocked by the filter arrangement such that little or no intensity of those rays is present optically downstream of the angle-selective filter arrangement. A filter arrangement having these properties may be described as a low pass filter in angular space.

The term "Transmittance" refers to the degree of loss of radiation intensity of a ray caused by the filter arrangement. The transmittance T may be quantified, for example, by the ratio $I_{OUT}/I_{IN}$ between an exit side intensity, $I_{OUT}$, of a ray optically downstream of the filter arrangement, i.e. after the ray has interacted with the filter arrangement, and an entry side intensity, $I_{IN}$, of the respective ray upstream of the filter arrangement, i.e. where the ray has not yet been affected by the filter arrangement.

The structure of the filter arrangement may be designed such that 80% or more, or 85% or more, or 90% or more of the intensity of rays falling within the pass band is still present in the rays optically downstream of the filter arrangement. On the other hand, there is typically a substantial blocking efficiency for rays falling within the stop band. For example, the intensity of rays with angles of incidence in the stop band is typically decreased by at least 90% or at least 95% or at least 98% such that less than 10% or even less than 5% or less than 2% of the intensity of those rays is present optically downstream of the angle-selective filter arrangement.

A filter effective structure of the angle-selective filter arrangement is designed such that a transition between the pass band and the stop band lies at a certain position in the angular space such that the condition $AOI_{CUT}=\arcsin(NA \times |\beta|)$ holds. In this condition, $|\beta|$ denotes the magnification of an image formation between the field surface lying at or near to the filter arrangement and the image surface of the projection objective. If this condition is fulfilled, the angle-selective filter arrangement substantially blocks rays with propagation directions which shall not contribute to image formation at the desired image-side numerical aperture NA, whereas rays with propagation directions desired for image formation pass the angle-selective filter arrangement in the pass band and may contribute to image formation.

While a mechanical aperture stop placed in a pupil surface is effective to block rays outside the inner edge of the opening of the aperture stop, an angle-selective filter arrangement according to this formulation acts as an aperture stop in angular space by discriminating rays by their angle of incidence at or near a field surface rather than by their position of incidence at or near a pupil surface. Since the angle-selective filter arrangement is arranged at or optically close to a field surface, and since the field surface is in Fourier transform relationship to a pupil surface of the projection objective, the angle-selective filter arrangement according to this formulation is capable of effectively blocking radiation not desired to contribute to image formation.

In some embodiments the filter arrangement is configured so that an integral transmittance of radiation from all angles of incidence in the stop band at $AOI>AOI_{CUT}$ is no more than 1% of an integral transmittance of radiation in the pass band at $AOI<AOI_{CUT}$. This allows for a very low level of parasitic radiation. The term "parasitic radiation" denotes radiation which is not desired for image formation but passes the filter. Depending on process parameters more severe threshold values may be used. For example, the cut-off angle may be defined such that no more than 0.2% of an integral transmittance of radiation in the pass band at $AOI<AOI_{CUT}$ passes the filter arrangement.

Alternatively, or in addition, the cut-off angle may be defined as an angle of incidence where a transmittance value of the filter function is 50% or less of a maximum transmittance in the pass band. In some cases the cut-off angle may be defined as an angle of incidence where a transmittance value of the filter function is 20% of a maximum transmittance in the pass band. In this case, the condition $T(AOI_{CUT})=0.2\ T_{MAX}$ holds. Where a lower level of parasitic radiation is allowable, more restrictive conditions may be defined. The condition $T(AOI_{CUT})=0.1\ T_{MAX}$ or the condition $T(AOI_{CUT})=0.04\ T_{MAX}$ may be fulfilled, for example.

It may be desired to have a relatively sharp transition between high transmittance (low attenuation) in the pass band and low transmittance (high attenuation) in the stop band to ensure that substantially all rays desired for an imaging are passed with little loss of intensity, whereas rays not desired for an image formation are blocked efficiently. In some embodiments, the filter function includes a transition between the pass band and the stop band around an angle of incidence with a maximum gradient of transmittance, where the maximum gradient of attenuation (or transmittance) is at least 40% transmittance per degree of angle of incidence. The transition may be steeper, for example with a maximum gradient of attenuation of at least 50% transmittance per degree of angle of incidence, or at least 55% transmittance per degree of angle of incidence, or more.

In general, the value of the cut-off angle of incidence, $AOI_{CUT}$, depends on the exposure system and process for which the filtering is desired. In some embodiments the cut-off angle of incidence is 8° or more or 10° or more or 12° or more. On the other hand, typical cut-off angles of incidence may be 25° or less, or 20° or less. A wide range of attractive NA values for dry or immersion projection objectives with useful reduction ratios, such as 4:1 or 5:1 may be covered. For example, in a 193 nm projection exposure system with a 4:1 reduction projection objective operating at NA=1.35 the cut-off angle for a filter arrangement placed close to the object surface may be close to 20°, such as about 19.7°.

In some embodiments the filter arrangement is arranged in a projection beam path optically near to the object surface of the projection objective. The term "optically near" refers to the fact that no other optical surface is between the object surface and the filter arrangement. In these embodiments the entire radiation entering the projection objective is already confined to those rays having propagation angles which are desired to contribute to image formation at the given NA value. The level of potentially detrimental radiation causing lens heating and/or loss of contrast is thereby reduced efficiently.

In some embodiments, the filter arrangement is arranged in an optical path between the mask and a first curved optical surface of an optical element of the projection objective. In this case the radiation incident on the filter arrangement is not yet influenced by optical power of an optical element of the projection objective, resulting in an advantage that the angle-limiting effect of the filter arrangement may be essentially constant across the entire field.

In some embodiments the filter arrangement is arranged in an optical path between the mask and the projection objective. In this case, the filter arrangement may be mounted independently of the mask and the projection objective, which facilitates insertion, removal and/or exchange of filter arrangements.

Where the projection objective is configured to create at least one real intermediate image between object surface and image surface, the filter arrangement may be arranged at or optically close to an intermediate image. This option may be used, for example, if a placement close to the object surface or to the mask is difficult, e.g. for lack of installation space.

The disclosure also relates to a projection exposure method, which may be performed using the projection exposure system according to the claimed disclosure. The method may include the following steps:

placing a mask providing a prescribed pattern optically between an illumination system and a projection objective such that the pattern is arranged in an object surface of the projection objective; illuminating the mask with illumination radiation having an operating wavelength λ; projecting an image of the pattern onto a radiation-sensitive substrate arranged in an image surface of the projection objective at an image-side numerical aperture NA; angle-selective filtering of radiation in a filter plane at or close to a field surface of the projection objective optically downstream of the pattern using an angle selective filter arrangement, wherein the angle-selective filter arrangement is effective to filter radiation incident on the filter arrangement according to an angle-selective filter function, the filter function including: a pass band with relatively high transmittance of intensity of incident radiation for angles of incidence smaller than a cut-off angle of incidence $AOI_{CUT}$, and a stop band with relatively low transmittance of intensity of incident radiation for angles of incidence greater than the cut-off angle of incidence $AOI_{CUT}$,
wherein the condition $AOI_{CUT}$=arcsin (NA*|β|) holds, with B being a magnification of an image formation between the field surface at or adjacent to the filter plane and the image surface of the projection objective.

Where a first filter arrangement having a first filter function with a first cut-off angle of incidence is exchanged for a second filter arrangement having a second filter function with a second cut-off angle of incidence greater or smaller than the first cut-off angle of incidence, the effective image-side numerical aperture of the process can be changed (increased or decreased) without manipulating a variable mechanical aperture stop.

This may be useful in connection with a mask change where a first mask providing a first pattern is exchanged for a second mask providing a second pattern different from the first pattern, where the first and second patterns involve different NA values for optimum imaging.

A variable mechanical aperture stop in the projection objective can be dispensed with if this method is applied. In some embodiments the projection objective has no variable mechanical aperture stop, which facilitates construction and improves stability of the system.

The previous and other properties can be seen not only in the claims but also in the description and the drawings, wherein individual characteristics may be used either alone or in sub-combinations as an embodiment of the disclosure and in other areas and may individually represent advantageous and patentable embodiments.

DETAILED DESCRIPTION OF THE PREFERRED EMBODIMENTS

In the following description of preferred embodiments, the term "optical axis" refers to a straight line or a sequence of a straight-line segments passing through the centers of curvature of optical elements. The optical axis can be folded by folding mirrors (deflecting mirrors) such that angles are included between subsequent straight-line segments of the optical axis. In the examples presented below, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible. The terms "optically upstream" and "optically downstream" refer to a relative position of elements in a beam path. If a first element is optically upstream of a second element, the first element is passed by radiation before the second element is passed. The second element is positioned optically downstream of the first element.

Figure 1:
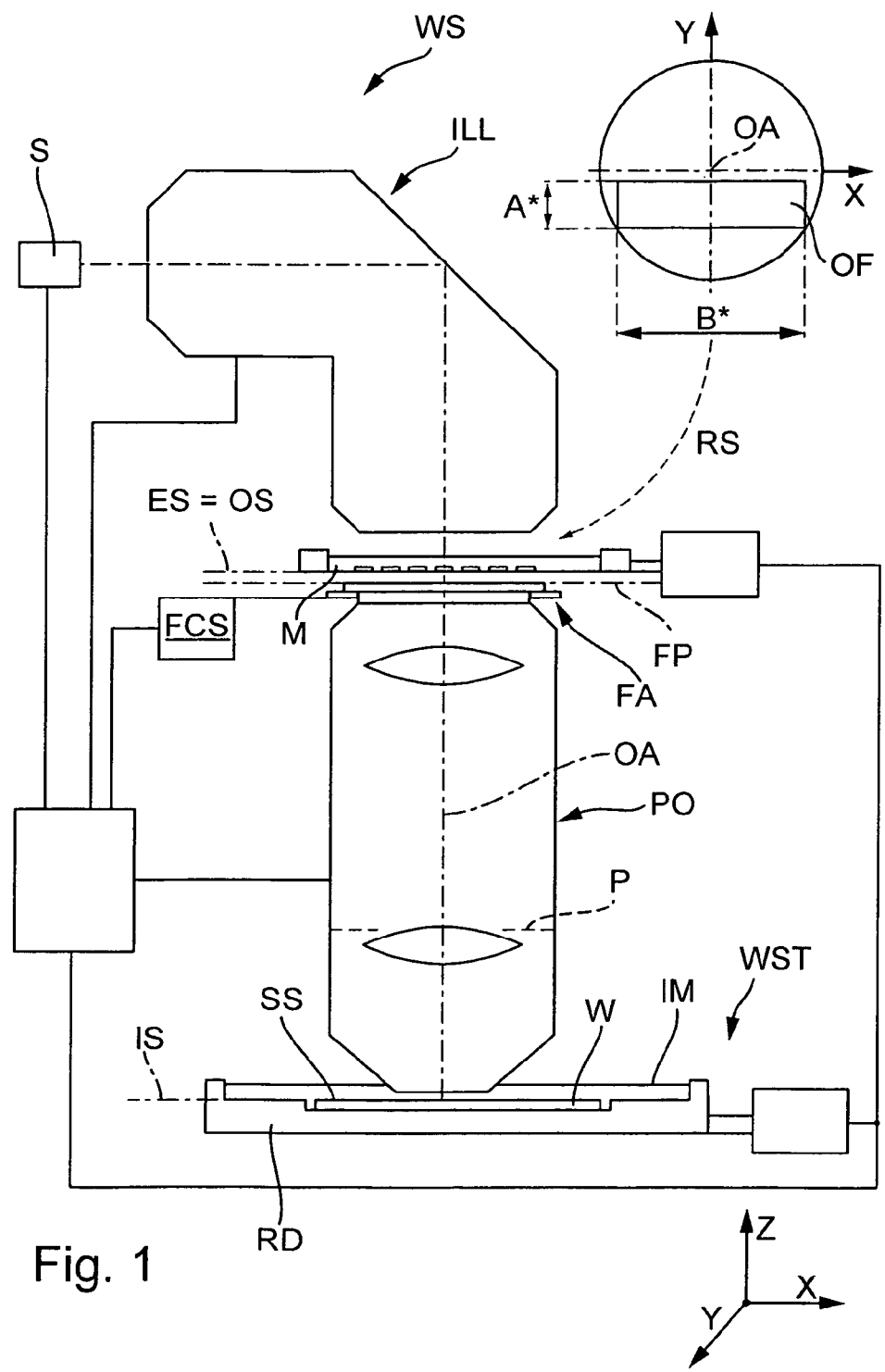
FIG. 1 shows schematically a microlithographic projection exposure system according to an embodiment.

FIG. 1 shows schematically a microlithographic projection exposure system in the form of a wafer scanner WS, which is provided for fabricating large scale integrated semiconductor components by immersion lithography in a step-and-scan mode. The projection exposure system includes as primary radiation source S an Excimer laser having an operating wavelength of λ≈193 nm. Other primary radiation sources are used in other embodiments, for example emitting at about 248 nm, 157 nm or 126 nm. An illumination system ILL optically downstream of the light source generates, in its exit surface ES, a large, sharply delimited, homogeneously illuminated illumination field that is adapted to the telecentric properties of the downstream projection objective PO. The illumination system ILL has devices for selecting the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS for holding and manipulating a mask M in such a way that a pattern formed on the mask lies in the exit surface ES of the illumination system, which coincides with the object surface OS of the projection objective PO. The device RS—usually referred to as "reticle stage"—for holding and manipulating the mask contains a mask holder and a scanner drive enabling the mask to be moved parallel to the object surface OS of the projection objective or perpendicular to the optical axis of projection objective and illumination system in a scanning direction (y-direction) during a scanning operation.

The reduction projection objective PO is designed to image an image of a pattern provided by the mask with a reduced scale of 4:1 onto a wafer W coated with a photoresist layer (magnification |β|=0.25). Other reduction scales, e.g. 5:1 or 8:1 are possible. The wafer W serving as a radiation-sensitive substrate is arranged in such a way that the macroscopically planar substrate surface SS with the photoresist layer essentially coincides with the planar image surface IS of the projection objective. The wafer is held by a device WST (wafer stage) including a scanner drive in order to move the wafer synchronously with the mask M in parallel with the latter. The wafer stage includes a z-manipulator mechanism to lift or lower the substrate parallel to the optical axis OA and the tilting manipulator mechanism to tilt the substrate about two axes perpendicular to the optical axis.

The device WST provided for holding the wafer W (wafer stage) is constructed for use in immersion lithography. It includes a receptacle device RD, which can be moved by a scanner drive and the bottom of which has a flat recess for receiving the wafer W. A peripheral edge forms a flat, upwardly open, liquid tight receptacle for a liquid immersion medium IM, which can be introduced into the receptacle and discharged from the latter using devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has a last optical element nearest to the image surface IS, the planar exit surface of the element being the last optical surface of the projection objective PO. During operation of the projection exposure system, the exit surface of the last optical element is completely immersed in the immersion liquid IM and is wetted by the latter.

In other embodiments the exit surface is arranged at a working distance of a few millimeters above the substrate surface SS of the wafer in such a way that there is a gas-filled gap situated between the exit surface of the projection objective and the substrate surface (dry system).

As shown schematically in the inset figure of FIG. 1, the illumination system ILL is capable of generating an illumination field having a rectangular shape. The size and shape of the illumination field determines the size and shape of the effective object field OF of the projection objective actually used for projecting an image of a pattern on a mask in the image surface of the projection objective. The effective object field has a length A* parallel to the scanning direction and a width B*>A* in a cross-scan direction perpendicular to the scanning direction and does not include the optical axis (off-axis field).

The projection objective PO may include a plurality of schematically indicated lens elements (typical numbers of lens elements are often more than 10 or more than 15 lenses) and, if appropriate, other transparent optical components. The projection objective may be purely dioptric (lens elements only). The projection objective may include at least one powered (curved) mirror, such as at least one concave mirror, in addition to lens elements, thereby forming a catadioptric projection objective.

For many applications in the field of microlithograpy the image-side numerical aperture of the projection objective is NA>0.6, and in many embodiments NA is between approximately NA=0.65 and NA=0.95, which can be achieved by dry objectives. Using an immersion system allows obtaining NA values NA≥1, such as NA≥1.1 or NA≥1.2 or NA≥1.3 or NA≥1.4 or NA≥1.5 or NA≥1.6 NA≥1.7 or above. Typical resolutions down to about 150 nm, or 130 nm, or 100 nm, or 90 nm or 50 nm or 40 nm or less are also possible basically depending on the combination of image-side NA and the wavelength of the radiation source.

The projection objective PO is an optical imaging system designed to form an image of an object arranged in the object surface OS in the image surface, which is optically conjugate to the object surface. The imaging may be obtained without forming an intermediate image, or via one or more intermediate images, for example two intermediate images.

In the projection objective without intermediate image one single pupil surface is formed between the object surface OS and the image surface IS. Where one or more intermediate images are formed, the projection objective has two or more pupil surfaces. In general, the pupil surface is in a Fourier transform plane with respect to a field surface, such as the object surface or an intermediate image surface or the image surface. A pupil surface P is schematically indicated in FIG. 1.

Figure 2:
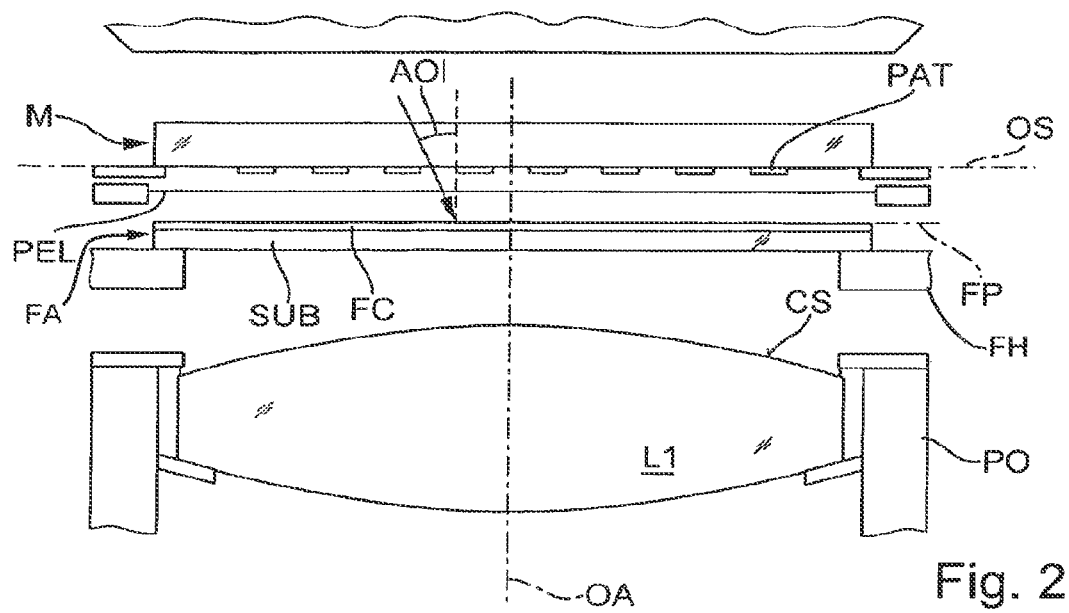
FIG. 2 shows a schematic detail of the region near the object surface of a projection objective where a filter arrangement and a pellicle are positioned between a mask and the projection objective.

As shown, for example, in FIGS. 1 and 2, an angle-selective filter arrangement FA is arranged at a filter plane FP optically close to the object surface OS of the projection objective in a projection beam path optically downstream of the pattern PAT carried or formed by the mask M. Specifically, the filter arrangement is arranged in the optical path between the mask M and the projection objective PO upstream of a first curved surface CS of an optical element of the projection objective (compare FIG. 2). The first curved surface is a convex entry surface of a first lens L1 of the projection objective in the embodiment, but may also be a concave surface. A transparent plane plate may be arranged between the filter arrangement and the first lens L1 in some embodiments.

A filter holder FH is provided to hold the filter arrangement in place between the mask and the projection objective. A filter changer system FCS operatively connected to the filter holder is provided to optionally insert the filter arrangement into the space between the mask and the projection objective or to remove the filter arrangement from the projection beam path. Different filter arrangements (i.e. filter arrangements with differing filter functions) may be provided in a storage or magazine such that a first filter arrangement having a first filter function can be exchanged for a second filter arrangement having a second filter function different from the first filter function. Thereby, a filter arrangement can be exchanged for another filter arrangement having different optical effect without interfering either with the mask or with the projection objective.

In the embodiment of FIG. 2, a thin transparent membrane forming a pellicle PEL is arranged on the pattern-side of the mask M between the mask and the filter arrangement FA. Where a pellicle is provided at a distance from the pattern, each dust or other particle depositing on the outside of the pellicle is arranged at a distance outside of the object surface OS of the projection objective when the pattern PAT arranged on the mask is arranged in the object surface. Therefore, the image of the pattern projected by the projection objective onto the wafer is not negatively influenced by dust particles or the like because those particles are not at the right position to be focused precisely on the substrate. Utilizing a pellicle protects the mask pattern and generally improves the output in semiconductor device production processes.

A cooling device configured to actively cool the filter arrangement may be provided to dissipate heat generated during operation, thereby stabilizing the optical performance. Further, a radiation absorber separate from the filter arrangement may be provided. The radiation absorber may be configured to absorb radiation blocked by the filter arrangement and reflected therefrom. The radiation absorber may be actively cooled. Thermal stability may be improved, and the level of undesired radiation may be reduced by these elements.

The angle-selective filter arrangement FA is in form of a transmission filter and includes a filter substrate SUB which, in the case of the embodiment of FIG. 2, is formed by a plane parallel plate made of a material substantially transparent to radiation at the operating wavelength. The filter substrate may be a plate made of fused silica or calcium fluoride, for example. An angle-selective multilayer filter coating FC is applied to the flat entry surface of the filter substrate facing the mask. In other embodiments a single filter coating may be applied to the exit side of the filter substrate (i.e. on the surface facing away from the mask). A substrate may be coated on both sides with a filter coating.

The sequence and structure of single layers as well as the material combinations of the multi layer filter coating are specifically configured such the angle-selective filter arrangement is effective to filter radiation incident on the filter arrangement from the mask side according to an angle-selective filter function. The filter function defines the dependency of the transmittance T of the filter arrangement for radiation as a function of the angle of incidence, AOI, of respective rays in the radiation being incident on the filter arrangement.

The planar filter coating is oriented perpendicularly to the optical axis OA of the projection objective such that the surface normal of the filter arrangement is parallel to the optical axis at each point on the filter arrangement FA. As the angle of incidence AOI, is generally defined as the angle enclosed between a ray impinging on the filter arrangement surface and the surface normal at the point of incidence, the angle of incidence AOI corresponds to the ray angle, i.e. the angle that a ray incident on the filter arrangement includes with the optical axis OA.

Figure 3:
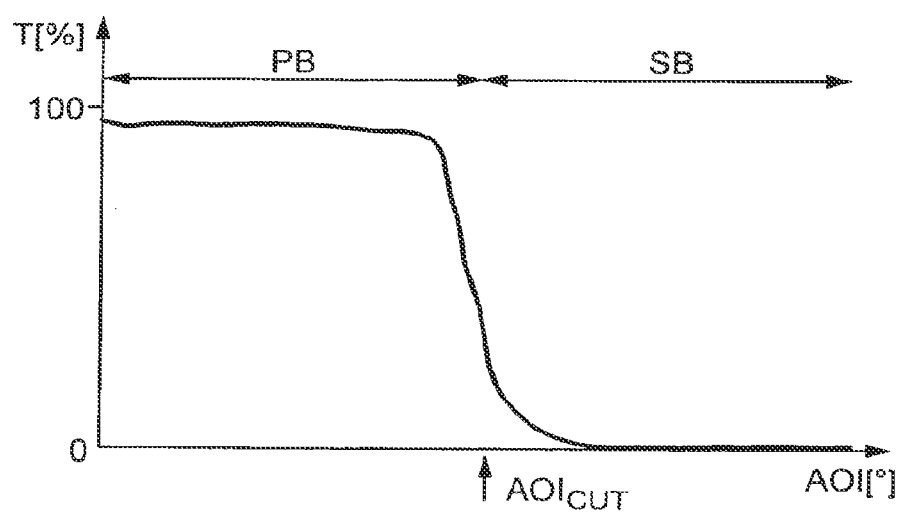
FIG. 3 shows schematically some characteristic features of an angle-selective low pass filter arrangement.

The angle-selective filter arrangement FA is designed as a low pass interference filter in the angle-of-incidence-domain. FIG. 3 shows schematically some characteristic features of low pass filters of this type. The filter function i.e. the function T=f(AOI) is characterized by a pass band PB with relatively high transmittance T of intensity of incident radiation for angles of incidence smaller than a cut-off angle of incidence $AOI_{CUT}$, and a stop band SB with relatively low transmittance for angles of incidence greater than the cut-off angle. As a result, rays incident at relatively small angles of incidence on the filter surface will pass the transmission filter arrangement FA with only little attenuation, thereby providing high intensity on the exit side of the filter arrangement. On the other hand, rays corresponding to angles of incidence larger that the cut-off angle are virtually blocked by the filter arrangement due to the fact that the transmittance T is very low for these angles.

As a result, the radiation beam downstream of the filter arrangement (i.e. on the image-side thereof) is constituted mainly of rays having angles of incidence corresponding to angles of incidence in the pass band PB, (i.e. $AOI<AOI_{CUT}$), whereas the intensity of rays having ray angles larger than the cut-off angle will have little or virtually no intensity.

The layer structure of the filter arrangement is configured such that the position of the cut-off angle $AOI_{CUT}$ in angular space matches the desired object-side numerical aperture NA of the projection objective for the specific process. Specifically, the cut-off angle is selected such that $AOI_{CUT}$=arcsin $NA_{OBJ}$, where $NA_{OBJ}$ is the object-side effective numerical aperture for the process. In an imaging system having a magnification factor β of the image formation between the object surface and the image surface, this corresponds to the condition $AOI_{CUT}$=arcsin (NA×|β|), where NA is the image-side numerical aperture of the projection objective.

It is seen that the low pass filter arrangement FA provided optically close to the object surface can have a similar limiting effect on the image-side numerical aperture NA as a mechanical aperture stop provided in a suitable pupil surface of the projection objective. While a mechanical aperture stop in a pupil surface blocks all rays trying to pass the pupil surface at positions outside the inner edge of the aperture stop, the angle-selective filter arrangement, positioned at or close to the position which has a Fourier transform relationship to the pupil surface of the projection objective blocks substantially all rays having angles of incidence larger than the cut-off angle, and transmits rays having angles of incidence smaller than the cut-off angle.

An angle-selective filter arrangement as described in this application may be preferred to a conventional mechanical aperture stop in a pupil surface of the projection objective for various reasons. For example, a mechanical aperture stop involves installation space in the region of the pupil surface of the projection objective. This, in turn, may limit the degrees of freedom for the optical designer of where to place lenses or other optical elements within the projection objective. In embodiments using an angle-selective filter arrangement a lens or a mirror or a pupil filter may be placed properly at the pupil surface.

Further, when using a mechanical aperture stop, it is usually preferable to have a reasonable correction status of the pupil in the projection objective in order to avoid drift of optical properties as the effective diameter is changed during operation. In embodiments using an angle-selective filter arrangement there may be less strict parameters for the correction status of the pupil.

Further, problems due to lens heating may be reduced by using an angle-selective filter arrangement at or close to the object surface of a projection objective instead of a mechanical aperture stop further downstream in the projection beam at a suitable pupil surface of the projection objective. Where a mechanical aperture stop is provided in the projection objective, rays having propagation angles beyond the limit of the numerical aperture may still heat lens portions of susceptible lenses or mirrors arranged upstream of the mechanical aperture stop, i.e. between the object surface and the aperture stop. Only in the region downstream of the mechanical aperture stop the angular spectrum of the rays is confined to rays that have been allowed to pass the aperture stop. On the other hand, if an angle-selective filter arrangement is placed upstream of a pupil surface, specifically outside of the projection objective between the mask and the projection objective, over aperture rays (i.e. rays corresponding to ray angles which are not desired for the image formation) can be prevented from entering the projection objective or at least can be reduced in intensity to such a degree that lens heating by those rays is virtually eliminated.

In some embodiments, such as in the embodiment of FIG. 1, the projection objective has no variable mechanical aperture stop to limit a cross-section of the projection beam at or close to pupil surface P. A fixed aperture stop may or may not be provided.

Figure 4:
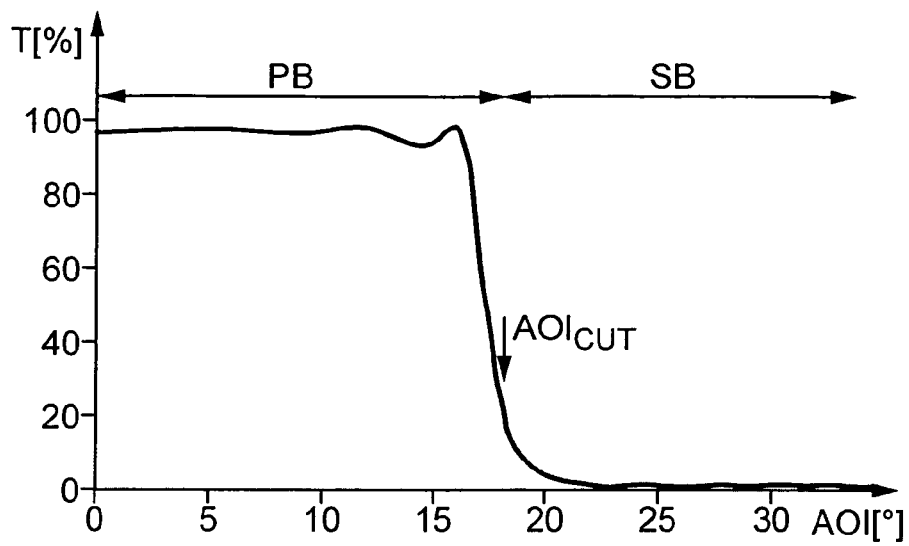
FIG. 4 is a diagram showing the functional relationship between angle of incidence AOI and transmittance T [%] of a first embodiment of a angle-selective transmission filter arrangement.

Numerical examples are now described in connection with FIG. 4. FIG. 4 is a diagram showing the functional relationship between the angle of incidence AOI and the transmittance T [%] of a first embodiment of a transmissive angle-selective filter arrangement. The filter arrangement includes a transparent filter substrate, e.g. made of fused silica, and an angle-selective dielectric multilayer filter coating applied to one surface of the substrate. This specification representing the structure of the multi-layer interference filter coating is given in Table 1. The filter arrangement is designed for an operating wavelength $\lambda=193.4$ nm.

TABLE 1

| # | thickness | Material |
|---|---|---|
| 1 | 322.441 | Chiolith |
| 2 | 25.573 | Al2O3 |
| 3 | 630.323 | Chiolith |
| 4 | 17.444 | Al2O3 |
| 5 | 55.91 | Chiolith |
| 6 | 17.089 | Al2O3 |
| 7 | 51.865 | Chiolith |
| 8 | 17.427 | Al2O3 |
| 9 | 49.473 | Chiolith |
| 10 | 16.487 | Al2O3 |
| 11 | 421.887 | Chiolith |
| 12 | 19.258 | Al2O3 |
| 13 | 264.894 | Chiolith |
| 14 | 21.034 | Al2O3 |
| 15 | 116.168 | Chiolith |
| 16 | 21.284 | Al2O3 |
| 17 | 42.253 | Chiolith |
| 18 | 20.059 | Al2O3 |
| 19 | 198.92 | Chiolith |
| 20 | 14.469 | Al2O3 |
| 21 | 53.276 | Chiolith |
| 22 | 10.268 | Al2O3 |
| 23 | 291.406 | Chiolith |
| 24 | 18.195 | Al2O3 |
| 25 | 43.248 | Chiolith |
| 26 | 20.919 | Al2O3 |
| 27 | 41.756 | Chiolith |
| 28 | 21.892 | Al2O3 |
| 29 | 116.24 | Chiolith |
| 30 | 21.278 | Al2O3 |
| 31 | 119.894 | Chiolith |
| 32 | 18.465 | Al2O3 |
| 33 | 51.403 | Chiolith |
| 34 | 13.963 | Al2O3 |
| 35 | 147.916 | Chiolith |
| 36 | 10.284 | Al2O3 |
| 37 | 56.489 | Chiolith |
| 38 | 18.839 | Al2O3 |
| 39 | 46.42 | Chiolith |
| 40 | 25.018 | Al2O3 |

In Table 1, the first column indicates the number of the respective layer of the coating from the substrate side (layer 0) towards the free surface of the reflective layer (40). The other columns show the geometrical thickness d [nm] of the layers and the respective material. Layers 1 to 40 form a dielectric multilayer stack with alternate layers of low refractive index material (here Chiolith ($Na_5Al_3F_{14}$)) and high refractive index material (here $Al_2O_3$).

Parameters n and k define the complex refractive index $N=n-ik$ of the material, where n is the real part of the complex refractive index and k is the imaginary part of the complex refractive index. The dimensionless absorption coefficient k, which is sometimes also referred to as the extinction coefficient, is related to the dimensional absorption coefficient $\alpha$ [1/cm] by the relation $k=(\alpha\lambda)/4\pi$, where $\lambda$ represents the corresponding wavelength of the light. Here n=1.85; k=0.001 for $Al_2O_3$ and n=1.38; k=0 for Chiolith.

The transmittance T is 96% or more for all angles AOI between 0° and about 13° and generally exceeds 90% up to about AOI=16.6°. A transition with a steep gradient of transmittance over angle of incidence is next to this region, where a maximum gradient is about 55% transmittance per degree angle of incidence (at about AOI=17°). Transmittance is about 28% at AOI=18° and about 7% at AOI=19°, with transmittance values generally below 2% for angles of incidence beyond about 20°. The transmittance has dropped to about 50% of the maximum value at about AOI=17.6° and to about 20% of the maximum value at about AOI=18.3°.

In a first numerical embodiment the filter arrangement is a plane parallel plate having the coating of Table 1 coated on one surface. The filter arrangement is inserted between a mask and a projection objective at the position optically close to the object surface. In the exemplary process the projection objective is desired to have an effective image-side numerical aperture NA=1.25. This value can be obtained by immersion lithography. Further, the projection objective has a 4:1 reduction ratio, i.e. the magnification B of image formation between the object surface and the image surface is $|\beta|=0.25$.

A suitable projection objective designed for a nominal UV-operating wavelength $\lambda=193$ nm is shown e.g. in FIG. 19 and discussed as embodiment 5 (Tables 9 and 10) in international patent application WO 2004/019128 A2. An image-side numerical aperture NA=1.25 is obtained at a reducing magnification 4:1 in a rectangular off-axis image field with size 26 mm×4 mm. The respective disclosure of that reference is incorporated herein by reference.

In an exemplary process no more than 1% of parasitic radiation is allowed. This can be accomplished by providing a filter where an integral of all transmittance values in an angular space beyond the cut-off angle (at higher angles of incidence) shall not be more than 1% of the integral of the transmittance values of all angles of incidence occurring in the process. In an alternative formulation a cut-off is desired at an angle of incidence where transmittance has dropped to 20% of its maximum value in the pass band.

The angle-selective filter having a filter function as shown in FIG. 4 meets the desired properties. The transmittance has dropped to 20% of the maximum value at AOI at about 18.3°, which value corresponds to the cut-off angle $AOI_{CUT}$ in an exemplary definition.

With $\sin(AOI_{CUT})=0.313$, $\sin(AOI_{CUT})=NA_{OBJ}$ and $NA=1/|\beta| NA_{OBJ}$ this corresponds to an effective image-side aperture NA=1.255.

If the amount of allowed parasitic intensity is limited to a maximum of 1% of the overall intensity, this would correspond to an 18.2° cut-off angle of incidence and to NA=1.249.

Therefore, the angle-selective filter arrangement having the filter function as shown in FIG. 4 substantially limits the image-side numerical aperture of the 4:1 reduction projection objective to NA≈1.25.

Figure 5:
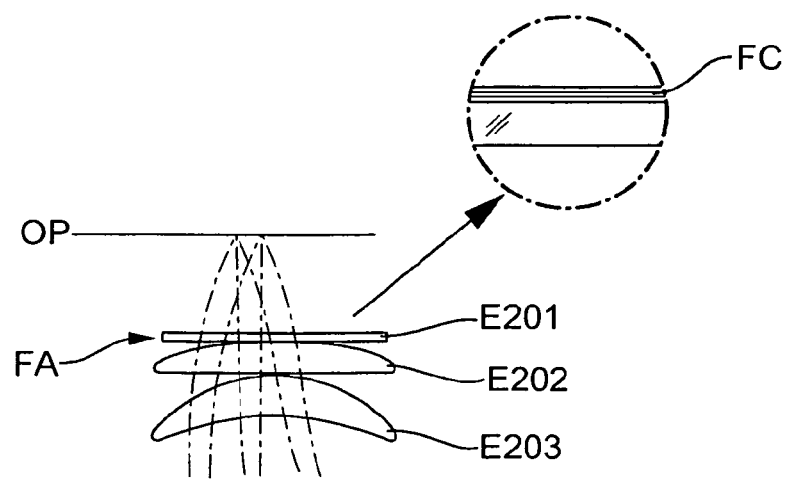
FIG. 5 shows an object-side end section of a catadioptric projection objective where a planar filter arrangement forms a first element of the projection objective.
Figure 6:
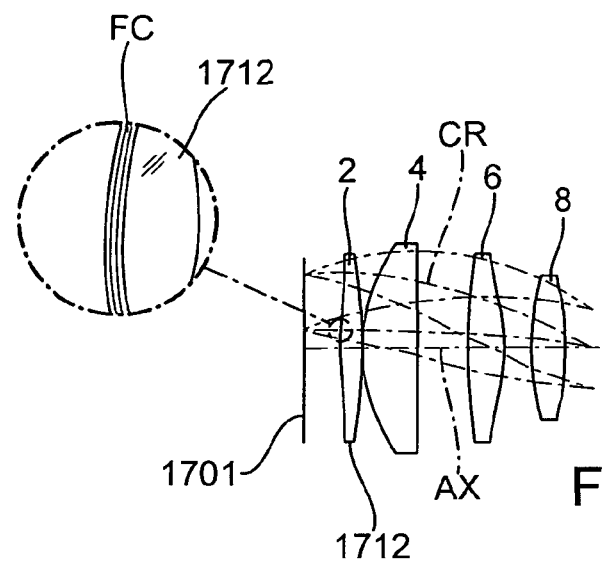
FIG. 6 shows an object-side end section of a catadioptric projection objective where the object side entry surface of a first lens is coated by a filter coating.

Further numerical examples are now presented in connection with FIGS. 5 and 6.

FIG. 5 shows an object-side entry section of a catadioptric projection objective designed for a nominal UV-operating wavelength $\lambda=193$ nm shown in FIG. 2 and specified in Tables 1 and 2 in international patent application WO 2004/019128 A2. FIG. 5 is based on a clipping of the original figure including the reference identification used in the reference document. An image-side numerical aperture NA=1.20 is possible at a reducing magnification 4:1 ($|\beta|=0.25$) in a rectangular off-axis image field. Maximum object height is Y'=14.318 mm. The respective disclosure of that reference is incorporated herein by reference.

The projection objective includes a transparent plane plate E201 forming the first optical element closest to the object surface OP. This plate is optically close to the object surface. Specifically, using the sub-aperture ratio SAR for quantification, SAR=0.32 at the front surface facing the object surface and SAR=0.33 at the image-side rear surface. The filter coating of table 1 may be formed on either side of the plate. In the example, the front side is coated by the filter coating FC (see inset figure). The projection objective depicted in FIG. 5 also includes lenses E202 and E203.

In an exemplary process the immersion projection objective is desired to have an effective image-side numerical aperture NA=1.20. Process tolerances are defined such that a cut-off is desired at an angle of incidence where transmittance has dropped to 50% of its maximum value in the pass band. This corresponds to $AOI_{CUT} \approx 17.6°$ in the filter coating of Table 1. With $\sin(AOI_{CUT})=0.302$, $\sin(AOI_{CUT})=NA_{OBJ}$ and $NA=1/|\beta| NA_{OBJ}$ this corresponds to an effective image-side aperture close to NA=1.20.

FIG. 6 shows an object-side entry section of a catadioptric projection objective designed for a nominal UV-operating wavelength λ=193 nm shown in FIG. 32 and specified in Tables 32 and 3A2 in international patent application WO 2005/069055 A2. FIG. 6 is based on a clipping of the original figure including the reference identification used in the reference document. An image-side numerical aperture NA=1.20 is possible at a reducing magnification 4:1 (|β|=0.25) in a rectangular off-axis image field. Maximum object height is Y'=16.5 mm. The respective disclosure of that reference is incorporated herein by reference.

The projection objective includes a thin biconvex positive lens 1712 made of fused silica, which forms the first optical element closest to the object surface 1701. This lens is optically close to the object surface. Specifically, using the sub-aperture ration SAR for quantification, SAR=0.13 at the front surface facing the object surface and SAR=0.16 at the image-side rear surface. The filter coating of table 1 may be formed on either side of the lens. In the example, the lens forms the filter substrate and the front side is coated (see inset figure).

In an exemplary process the immersion projection objective is desired to have an effective image-side numerical aperture NA=1.20. Process tolerances are defined such that a cut-off is desired at an angle of incidence where transmittance has dropped to 50% of its maximum value in the pass band. This corresponds to $AOI_{CUT} \approx 17.6°$ in the filter coating of Table 1. With $\sin(AOI_{CUT})=0.302$, $\sin(AOI_{CUT})=NA_{OBJ}$ and $NA=1/|\beta| NA_{OBJ}$ this corresponds to an effective image-side aperture close to NA=1.20.

The front surface supporting the filter coating is slightly curved with a radius of curvature of about 585 mm. The curvature influences the optical effect of the filter coating since the angles of incidence on the curved surface do not correspond exactly to the ray angles the ray include with the optical axis. This effect may be compensated at least partly by adjusting the telecentric properties of the radiation exiting the illumination system. Specifically the telecentric angle may vary slightly as a function of the field coordinate. In general, if the filter coating is formed on a curve surface, the curvature should be moderate (large radius if curvature, for example greater that 400 mm or greater than 500 mm or more).

Figure 7:
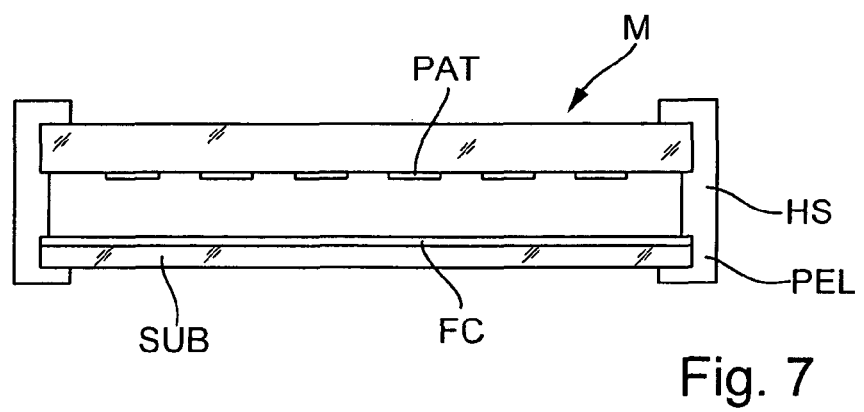
FIG. 7 shows an embodiment of an angle-selective filter arrangement where a substrate carrying a filter coating is a pellicle.

There are various ways to implement embodiments of the disclosure in a projection exposure apparatus. In the embodiment of schematic FIG. 7, the substrate SUB carrying the filter coating FC is in the form of a relatively thin membrane forming a pellicle PEL. In general, where a pellicle is used as a filter substrate, the angle-selective filter arrangement can be positioned very close to the pattern of the mask. In the embodiment, a holding structure HS is provided to fix the pellicle (filter arrangement) in predetermined position at a small distance on the pattern-side of the mask. The holding structure also engages the perimeter of the mask such that the mask and the filter arrangement FA form a unit which can be exchanged together. The filter function of the filter coating can be adapted to the pattern structure to provide an effective image-side numerical aperture most suited to image the features of the pattern PAT.

In another embodiment, not shown in a figure, the filter coating of the angle-selective filter arrangement is formed on a pellicle which can be exchanged independent of the mask.

Depending on the properties imposed on the desired filter function it may be difficult to obtain an optimum filter function with only one angle-selective filter. In some embodiments, a succession of two or more filter arrangements arranged in sequence in the optical path may be provided. For example, the filter functions of two filter arrangements successively arranged in the optical path may be adapted to each other such that each of the filter coatings provides part of the blocking action in the stop band, while both filter arrangements have high transmittance in the pass band.

Figure 8:
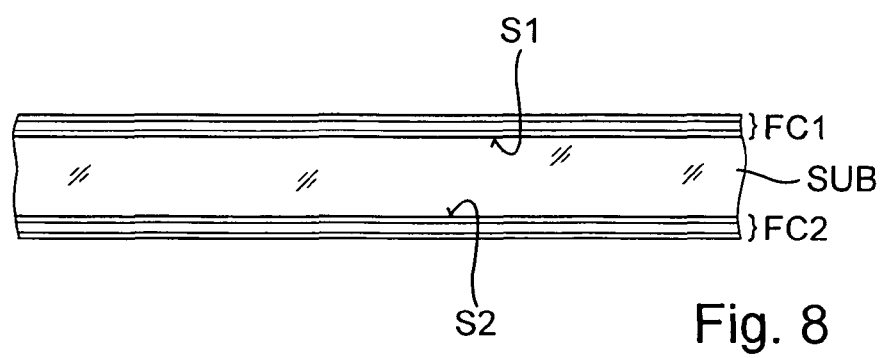
FIG. 8 shows a filter arrangement including a transparent filter substrate coated on both sides with angle-selective filter coatings.

In an embodiment schematically shown in FIG. 8, the filter arrangement includes a transparent filter substrate SUB coated on both sides. The filter substrate has a first surface S1 coated with a first angle-selective filter coating FC1 and a second surface S2 coated with a second angle-selective filter coating FC2 different from the first angle-selective filter coating, wherein filter functions of the first and second filter coatings complement each other to generate the overall filter function (composite filter function) of the filter arrangement.

Figure 9A:
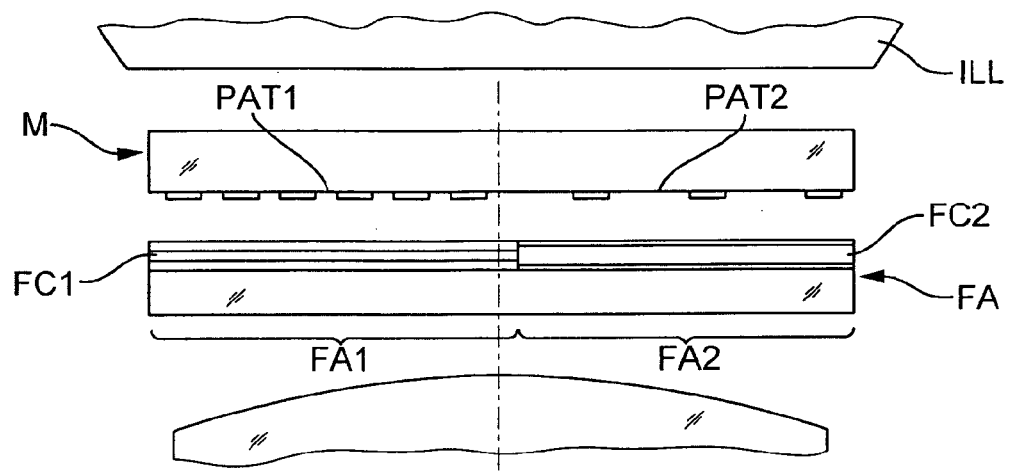
FIG. 9A shows an angle-selective filter arrangement providing different adjacent first and second filter coatings for different parts of a mask.

In some applications a mask may have two or more partial patterns (or sub-patterns) arranged side by side, where the partial patterns have different structure. For example, one partial pattern may include densely packed parallel lines involving a relatively high resolution corresponding to a relatively high image-side numerical aperture, whereas another partial pattern may have contact holes or other coarser features which would preferably be imaged at lower image-side numerical aperture in order to increase the depth of focus (DOF), for example. An angle-selective filter arrangement according to an embodiment may be used to provide different effective image-side numerical apertures for different parts of a mask. In the embodiments schematically shown in FIG. 9A the mask M has two mutually adjacent patterns areas with different sub-patterns PAT1 and PAT2 formed on an exit-side of the mask. First sub-pattern PAT1 here includes densely packed parallel lines. Second sub-pattern PAT2 includes a line pattern with larger line pitch and larger line width, i.e. a coarser pattern.

Figure 9B:
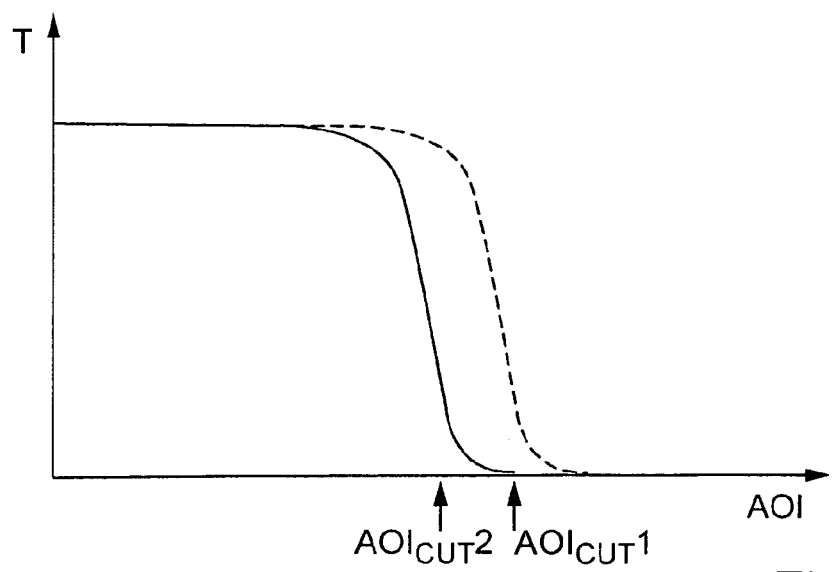
FIG. 9B shows the filter functions of the first and second filter coatings of FIG. 9A.

The corresponding filter arrangement FA has two corresponding filter areas FA1 and FA2, respectively. First filter area FA1 is arranged in the optical path immediately downstream of first sub-pattern PAT1, whereas second filter area FA2 is arranged immediately downstream of second pattern area PAT2. First filter coating FC1 in the first filter area FA1 is adapted to provide a first cut-off angle of incidence ($AOI_{CUT}1$) corresponding to a relatively high image-side numerical aperture NA1 best suited to provide high resolution (see FIG. 9B). Second filter coating FC2 has different layer structure and/or material combination and is configured to provide a second cut-off angle $AOI_{CUT}2<AOI_{CUT}1$, which corresponds to a smaller image-side numerical aperture and larger depths of focus.

This arrangement may be useful both in step-and-repeat processes and in step-and-scan processes. In a step-and-repeat process the two pattern areas PAT1, PAT2 are imaged simultaneously, while a larger NA is effective for the finer pattern PAT1 and a smaller resolution is provided for the coarser pattern PAT2. In a step-and-scan process the pattern areas may be imaged simultaneously or successively depending on the relative orientation between the scanning direction and the adjacent sub-patterns.

Dielectric filter coatings suitable for forming an angle-selective filter arrangement may be structured in various ways. In the following, some examples are given, from which variants may be derived to provide a filter arrangement with a desired blocking efficiency and desired cut-off angle. In the examples, the filter coatings include layers having certain fractions of a quarter wave thickness $d(\lambda/4)$ which is defined as $d(\lambda/4)=\lambda(nm)/(4*n*\cos\alpha')$, where $\alpha'$ is the refracted angle in the Snellius law of refraction ($n_0*\sin\alpha_0=n*\sin\alpha'$), where $\alpha_0$ is the angle of incidence and $n_0$ is the refractive index on the incidence side medium.

Suitable angle-selective filter coatings with an efficient stop band having virtually no transmittance for the operating wavelength may be derived from reflective dielectric layer structures which have high transmittance (pass band) outside of a reflecting band having very low transmittance (stop band).

In the following notations for multi layer structures "H" represents a high refractive index material and "L" represent a low reflective index material, i.e. the material which has a lower refractive index than the high refractive index material. All embodiments are calculated for $Al_2O_3$ as high index material and Chiolith as low reflective index material. As mentioned above, n=1.85; k=0.001 for $Al_2O_3$ and n=1.38; k=0 for Chiolith.

The term (1H1L) represents a layer pair consisting of one higher refractive index layer and a lower refractive index layer. A number behind the bracket represents the number of subsequent pairs in the layer structure. The angular term $(\lambda/4)$ 41° represents the angle for which the quarter wave thickness is calculated. The term 1L represents one single low refractive quarter wave layer. The term 1.70L represents a layer of low refractive material having 1.7 times the quarter wave thickness for the respective angle.

Figure 10:
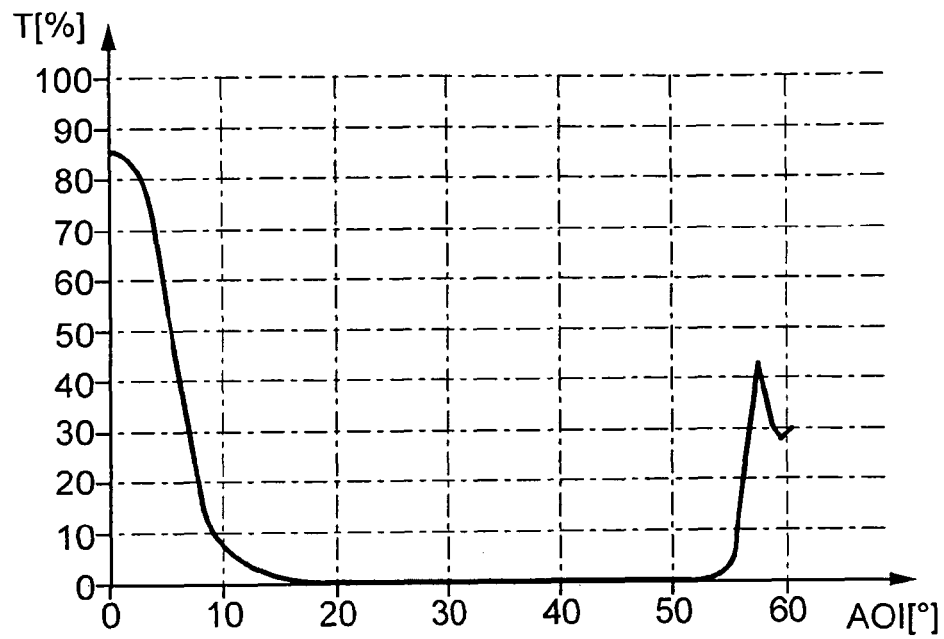
FIGS. 10 to 13 show filter functions of different dielectric multilayer interference coatings with a pass band at low angles of incidence and a stop band at high angles of incidence.

FIG. 10 shows a diagram of the filter function of a substrate coated on one side with a filter coating according to: (1H1L) 23 $(\lambda/4)$ 41°. This simple design has a narrow pass band, relatively smooth transition and a wide stop band. The cut-off angle of incidence is about 8°. This system may serve as a reference system.

Figure 11:
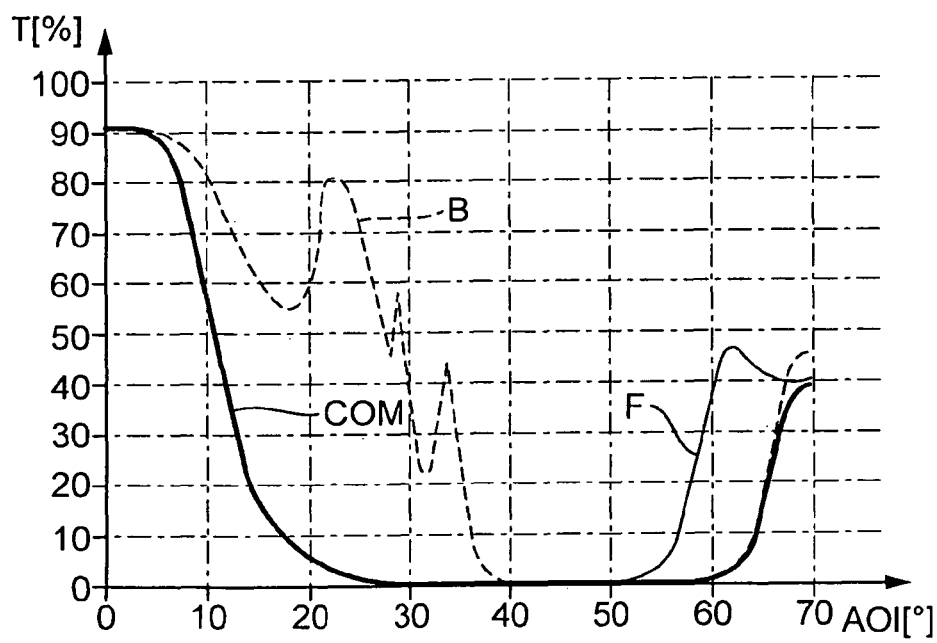

In order to increase the angular width of the pass band, multiple layer structures for dielectric mirrors may be combined either by coating one side of a substrate with subsequent narrow bandwidth coatings or by coating both sides of a transparent substrate accordingly. FIG. 11 shows schematically the filter function of a filter arrangement having a first coating on the front side (F) and a second coating on the back side (B) of a plane parallel substrate (compare FIG. 8). The first coating is (1L1H)14 1L $(\lambda/4)$ 44° and the second coating is (1L1H)20 $(\lambda/4)$ 44°. The combined resulting filter function COM features the width of the pass band and the steepness of the transition between pass band and stop band according to the first coating on the front side, whereas the behaviour at higher angles of incidence above 50° is determined by the properties of the back side coating. The cut-off angle of incidence is between about 16° and 18.

Figure 12:
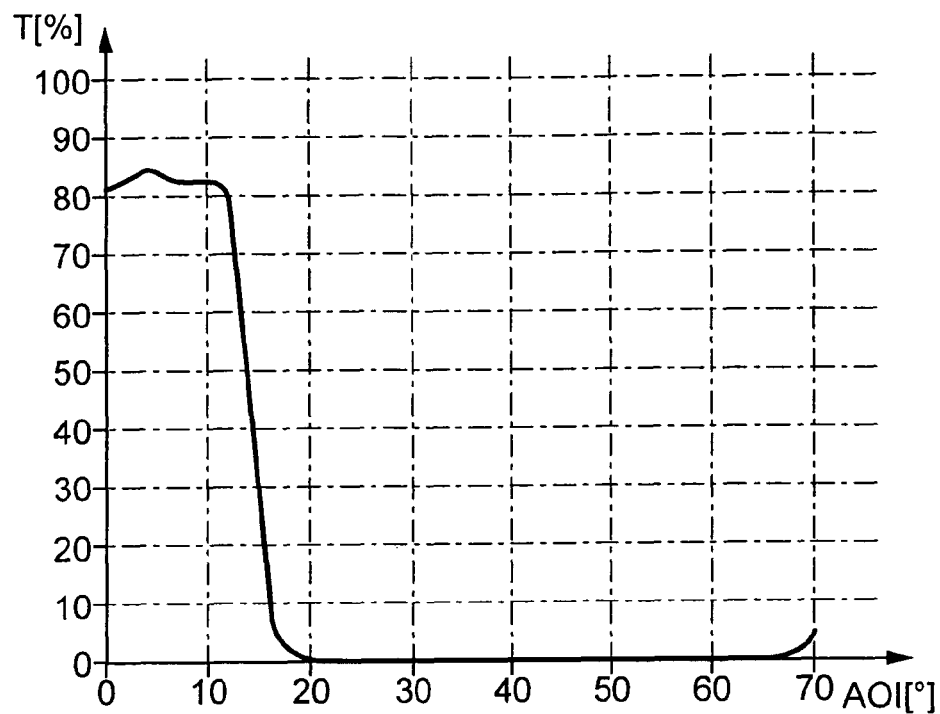

Improvements with respect to band width of the pass band and/or steepness of the transition between pass band and stop band may be obtained if a multilayer filter coating includes one and more layers having their thickness above or below a quarter wave thickness. For example, the multi layer filter coating may be structured according to a Fabry Perot design. In particular, the filter coating may include one or more single layers of the lower refractive index material having a layer thickness larger than the corresponding quarter wave thickness, the lower effective layer being sandwiched between two quarter wave layers of the high refractive index material. The filter function of a multi layer filter coating according to Fabry Perot design formed on one side of the substrate is shown in FIG. 12. The layer structure is as follows: (1H1L) 11 1H 1.70L 1H (1L1H)10 2.00L (1H' 1L')10 1H' 1.73L' 1H' (1L' 1H')10. Layers H and L are calculated for $(\lambda/4)$ 47°. Layers H' and L' are calculated for $(\lambda/4)$ 57°. As seen in FIG. 12, a high transmittance pass band extends to about 14° and is followed by a steep transition with almost no transmittance for angles of incidence beyond about 18°.

Figure 13:
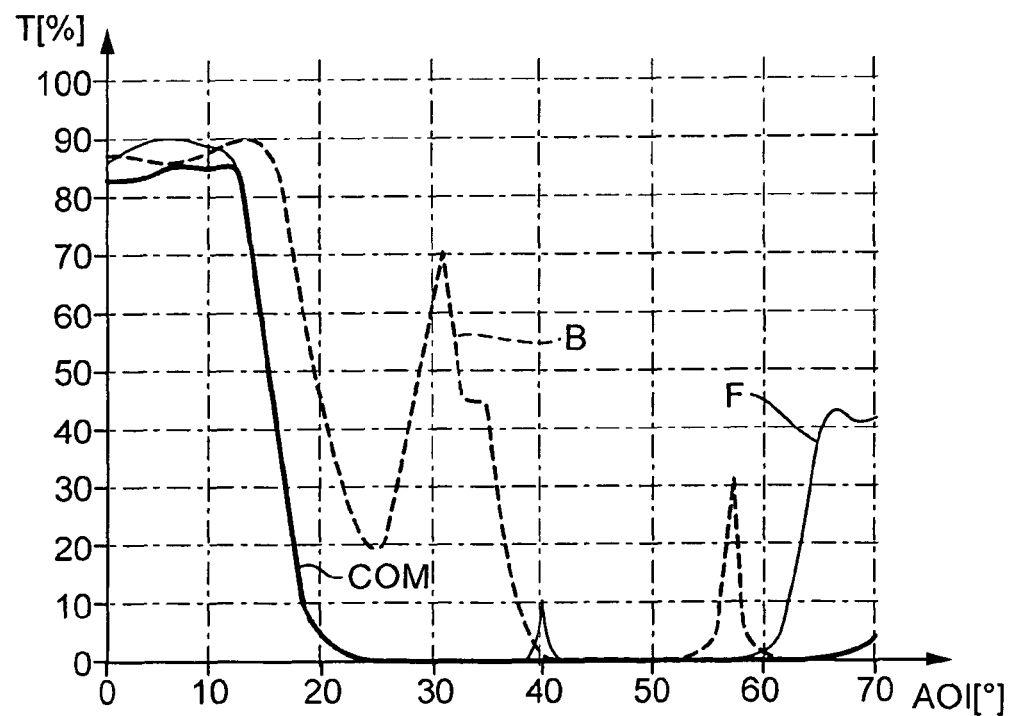

FIG. 13 shows the combined filter function of a filter arrangement having a transparent substrate coated on both sides with dielectric filter coatings. The first coating on the front side corresponds to: (1H1L)11 1H 1.7L 1H (1L1H10 for $(\lambda/4)$ 47°. The second coating on the back side corresponds to (1H1L)11 1H 2L 1H (1L1H)11 for $(\lambda/4)$ 54°. It is seen that the combined transmittance in the pass band for angles of incidence between 0° and about 12° is about 85% resulting from individual transmittances of the single side coatings but without reflection loss on the uncoated backside. A narrow transition with steep transmittance gradient exists for angles of incidence between 12° and about 18°. The stop band extends beyond to very high angles of incidence, where the high angle end of the filter coating is dominated by the behaviour of the back side coating. The cut-off angle of incidence is at about 16°.

As an alternative to quarter wave Fabry Perot design, non-quarter wave Fabry Perot designs may be used.

The above description of the preferred embodiments has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof.

The content of all the claims is made part of this description by reference.

What is claimed is:

1. A system, comprising:
   an illumination system configured to illuminate a mask with radiation, the mask having a pattern;
   a projection objective configured to project an image of the pattern arranged in an object surface of the projection objective onto a radiation-sensitive substrate arranged in an image surface of the projection objective at an image-side numerical aperture (NA);
   an angle-selective filter arrangement arranged at or close to a field surface of the projection objective in a projection beam path optically downstream of the object surface, the angle-selective filter arrangement being effective to filter radiation incident on the filter arrangement according to an angle-selective filter function comprising:
   a pass band with relatively high transmittance of intensity of incident radiation for angles of incidence smaller than a cut-off angle of incidence ($AOI_{CUT}$); and a stop band with relatively low transmittance of intensity of incident radiation for angles of incidence greater than the cut-off angle of incidence $AOI_{CUT}$,
wherein:

$$AOI_{CUT}=\arcsin(NA^*|\beta|);$$

$\beta$ is a magnification of an image formation between the field surface at or adjacent to the filter plane and the image surface of the projection objective;
an integral transmittance of radiation from all angles of incidence in the stop band at $AOI>AOI_{CUT}$ is no more than 1% of an integral transmittance of radiation in the pass band at $AOI<AOI_{CUT}$;
the mask comprises a first partial pattern and a second partial pattern which are arranged side by side;
the first and second partial patterns have different structure;
the filter arrangement comprises a first filter area in the optical path downstream of the first partial pattern;
the filter arrangement has a second filter area downstream of the second partial pattern area;
a first filter coating in the first filter area is configured to provide a first cut-off angle of incidence corresponding to a first image-side numerical aperture; and
a second filter coating is configured to provide a second cutoff angle which is greater or smaller than the first cut-off angle.

2. The system of claim 1, wherein the cut-off angle of incidence is as an angle of incidence where a transmittance value of the filter function is 50% or less of a maximum transmittance in the pass band.

3. The system of claim 1, wherein the filter function further comprises a transition between the pass band and the stop band around an angle of incidence with a maximum gradient of transmittance which is at least 40% transmittance per degree of angle of incidence.

4. The system of claim 1, wherein the filter arrangement is optically upstream of a last pupil surface of the projection objective.

5. The system of claim 1, wherein the filter arrangement is configured so that at least one optical surface of the filter arrangement is at a position where a sub-aperture ratio is less than 0.4.

6. The system of claim 1, wherein the filter arrangement is in a projection beam path optically near the object surface.

7. The system of claim 1, wherein the filter arrangement is in an optical path between the mask and a first curved surface of an optical element of the projection objective.

8. The system of claim 1, wherein the filter arrangement is arranged on an optical path between the mask and the projection objective.

9. The system of claim 1, wherein the filter arrangement is exchangeable.

10. The system of claim 1, further comprising a filter changing system configured so that a first filter arrangement having a first filter function is exchangeable with a second filter arrangement having a second filter function different from the first filter function.

11. The system of claim 1, wherein the filter arrangement comprises a filter substrate comprising a material which is substantially transparent to the radiation at an operating wavelength of the radiation, and the filter substrate includes a substrate surface supporting a first angle-selective multilayer filter coating.

12. The system of claim 11, wherein the filter substrate is a plane plate.

13. The system of claim 11, wherein the filter substrate is a pellicle.

14. The system of claim 11, wherein the filter substrate is lens element.

15. The system of claim 11, wherein the filter substrate has a first surface supporting the first angle-selective filter coating, the filter substrate has a second surface supporting a second angle-selective filter coating, and filter functions of the first and second angle-selective filter coatings complement each other to generate a composite filter function of the filter arrangement during use of the system.

16. The system of claim 1, wherein the projection objective has no variable mechanical aperture stop to limit a cross-section of the projection beam at or close to pupil surface.

17. A system, comprising:
an illumination system configured to illuminate a mask with radiation, the mask having a pattern;
a projection objective configured to project an image of the pattern arranged in an object surface of the projection objective onto a radiation-sensitive substrate arranged in an image surface of the projection objective at an image-side numerical aperture (NA);
an angle-selective filter arrangement arranged at or close to a field surface of the projection objective in a projection beam path optically downstream of the object surface, the angle-selective filter arrangement being effective to filter radiation incident on the filter arrangement according to an angle-selective filter function comprising:
a pass band with relatively high transmittance of intensity of incident radiation for angles of incidence smaller than a cut-off angle of incidence ($AOI_{CUT}$); and
a stop band with relatively low transmittance of intensity of incident radiation for angles of incidence greater than the cut-off angle of incidence $AOI_{CUT}$,
wherein:

$$AOI_{CUT}=\arcsin(NA\cdot|\beta|);$$

$\beta$ is a magnification of an image formation between the field surface at or adjacent to the filter plane and the image surface of the projection objective;
the cut-off angle of incidence is as an angle of incidence where a transmittance value of the filter function is 50% or less of a maximum transmittance in the pass band;
the mask comprises a first partial pattern and a second partial pattern which are arranged side by side;
the first and second partial patterns have different structure;
the filter arrangement comprises a first filter area in the optical path downstream of the first partial pattern;
the filter arrangement has a second filter area downstream of the second partial pattern area;
a first filter coating in the first filter area is configured to provide a first cut-off angle of incidence corresponding to a first image-side numerical aperture; and
a second filter coating is configured to provide a second cutoff angle which is greater or smaller than the first cut-off angle.

18. The system of claim 17, wherein the filter function further comprises a transition between the pass band and the stop band around an angle of incidence with a maximum gradient of transmittance which is at least 40% transmittance per degree of angle of incidence.

19. The system of claim 17, wherein the filter arrangement is optically upstream of a last pupil surface of the projection objective.

20. The system of claim 17, wherein the filter arrangement is configured so that at least one optical surface of the filter arrangement is at a position where a sub-aperture ratio is less than 0.4.

21. The system of claim 17, wherein the filter arrangement is in a projection beam path optically near the object surface.

22. The system of claim 17, wherein the filter arrangement is in an optical path between the mask and a first curved surface of an optical element of the projection objective.

23. The system of claim 17, wherein the filter arrangement is arranged on an optical path between the mask and the projection objective.

24. The system of claim 17, wherein the filter arrangement is exchangeable.

25. The system of claim 17, further comprising a filter changing system configured so that a first filter arrangement having a first filter function is exchangeable with a second filter arrangement having a second filter function different from the first filter function.

26. The system of claim 17, wherein the filter arrangement comprises a filter substrate comprising a material which is substantially transparent to the radiation at an operating wavelength of the radiation, the filter substrate includes a substrate surface supporting an angle-selective multilayer filter coating.

27. The system of claim 26, wherein the filter substrate is a plane plate.

28. The system of claim 26, wherein the filter substrate is a pellicle.

29. The system of claim 26, wherein the filter substrate is a lens element.

30. The system of claim 26, wherein the first filter coating comprises a first angle-selective filter coating, the second filter coating comprises a second angle-selective filter coating different from the first angle-selective filter coating, and filter functions of the first and second filter coatings complement each other to generate a composite filter function of the filter arrangement during use of the system.

31. The system of claim 17, wherein the projection objective has no variable mechanical aperture stop to limit a cross-section of the projection beam at or close to pupil surface.

32. A method of operating a projection exposure system comprising an illumination system and a projection objective, the method comprising:

using the illumination system to illuminate a mask with illumination radiation, the mask being disposed in an object surface of the projection objective;

using the projection objective to project an image of a pattern of the mask onto a radiation-sensitive substrate arranged in an image surface of the projection objective at an image-side numerical aperture NA; and using an angle selective filter arrangement to perform angle-selective filtering of radiation in a filter plane at or close to a field surface of the projection objective optically downstream of the pattern, wherein:

the angle-selective filter arrangement is effective to filter radiation incident on the filter arrangement according to an angle-selective filter function comprising:

a pass band with relatively high transmittance of intensity of incident radiation for angles of incidence smaller than a cut-off angle of incidence ($AOI_{CUT}$);

a stop band with relatively low transmittance of intensity of incident radiation for angles of incidence greater than the cut-off angle of incidence $AOI_{CUT}$;

$$AOI_{CUT}=\arcsin(NA*|\beta|);$$

$\beta$ is a magnification of an image formation between the field surface at or adjacent to the filter plane and the image surface of the projection objective; and an integral transmittance of radiation from all angles of incidence in the stop band at $AOI>AOI_{CUT}$ is no more than 1% of an integral transmittance of radiation in the pass band at $AOI<AOI_{CUT}$;

the mask comprises a first partial pattern and a second partial pattern which are arranged side by side;

the first and second partial patterns have different structure;

the filter arrangement comprises a first filter area in the optical path downstream of the first partial pattern;

the filter arrangement has a second filter area downstream of the second partial pattern area;

a first filter coating in the first filter area is configured to provide a first cut-off angle of incidence corresponding to a first image-side numerical aperture; and a second filter coating is configured to provide a second cutoff angle which is greater or smaller than the first cut-off angle.

33. The method of claim 32, further comprising exchanging the mask with a mask that comprising at least one different pattern.

* * * * *